US005557619A

United States Patent [19]
Rapoport

[11] Patent Number: 5,557,619
[45] Date of Patent: Sep. 17, 1996

[54] INTEGRATED CIRCUITS WITH A PROCESSOR-BASED ARRAY BUILT-IN SELF TEST CIRCUIT

[75] Inventor: Stuart Rapoport, Washington, D.C.

[73] Assignee: International Business Machines Corporation, Armonk, N.Y.

[21] Appl. No.: 223,078

[22] Filed: Apr. 4, 1994

[51] Int. Cl.⁶ .............................. G06F 11/00; G06F 11/27
[52] U.S. Cl. ........................ 371/22.5; 371/21.1; 371/21.2
[58] Field of Search ................................. 371/21.2, 22.5, 371/25.1, 22.5, 27, 21.1, 22.4, 22.3, 27; 365/233; 395/183.18

[56] References Cited

U.S. PATENT DOCUMENTS

| | | | |
|---|---|---|---|
| 4,703,257 | 10/1987 | Nishida et al. | 324/73 R |
| 5,138,619 | 8/1992 | Fasang et al. | 371/21.1 |
| 5,173,906 | 12/1992 | Dreibelbis et al. | 371/22.5 |
| 5,258,986 | 11/1993 | Zerbe | 371/21.2 |
| 5,369,648 | 11/1994 | Nelson | 371/27 |
| 5,386,392 | 1/1995 | Cantiant et al. | 365/233 |
| 5,442,641 | 8/1995 | Beranger et al. | 371/21.2 |

FOREIGN PATENT DOCUMENTS 0240199  3/1987  European Pat. Off.

OTHER PUBLICATIONS

"Dynamic Self–Repair Redundancy System" IBM Corp., Technical Disclosure Bulletin, V. 34, No. 5, pp. 448–449, Oct. 1991.

*Primary Examiner*—Robert W. Beausoliel, Jr.
*Assistant Examiner*—Nadeem Iqbal
*Attorney, Agent, or Firm*—H. Daniel Schnurmann

[57] ABSTRACT

A processor-based Array Built-in Self Test (ABIST) circuit that generates self-test patterns for high speed SRAMs or DRAMs having a short access time. The circuit includes three main blocks: a conventional address generator for generating self-test addressing signals, a subset of which are used by a control logic main block. This control logic block forces proper signal sequencing of the processing main block during the ABIST mode. The processing main block includes, preferably, three generators for preparing signals for use during the next cycle. These signals are respectively stored in two latches to generate the corresponding expected output data one cycle later. The processor-based ABIST circuit allows for faster data generation, minimal semiconductor area consumption, extended programmability and full compatibility.

7 Claims, 5 Drawing Sheets

INTEGRATED CIRCUITS WITH A PROCESSOR-BASED ARRAY BUILT-IN SELF TEST CIRCUIT

FIELD OF THE INVENTION

The present invention relates to the test of integrated circuits of the memory type, having self-test capabilities for logic and memory fault detection. It more particularly relates to a new processor-based ABIST (Array Built-in Self-Test) circuit.

BACKGROUND OF THE INVENTION

As memories grow faster, denser and more complex, there is an increased demand on ABIST structures for logic and memory fault detection offering high speed and high test coverage, while at the same time consuming minimal area on the semiconductor chip. By way of example, FIG. 1 shows the block diagram architecture of a state of the art SRAM macro 10 provided with an ABIST unit 11. A similar architecture is described in U.S. Pat. No. 5,173,906 of common assignee. The functional units shown in FIG. 1, either form part of a stand-alone SRAM or the SRAM macro of logic array of an integrated circuit chip. In the latter case, the chip may include a plurality of such macros, each provided with its own dedicated ABIST unit. The integrated circuit chip described is part of a wafer fabricated in a very large scale integration (VLSI) semiconductor technology and is presumed to be designed according to level-sensitive scan design (LSSD) rules.

As known to those skilled in the art, the SRAM macro 10 of FIG. 1 has three basic modes of operation: a SYSTEM mode, in which the SRAM macro 10 operates normally, i.e., where the memory unit 12 is either read or written, using the data-in signals DATAIN1 to DATAINM, the SRAM address signals ADDIN1 to ADDINP, and the read/write control signal R/WIN (wherein M and P are, respectively the bit widths of the data-in bus DATAIN and the SRAM address bus ADDIN). A second mode is required to satisfy LSSD requirements: the SCAN mode which is used for initializing/analyzing (SCAN-IN/SCAN-OUT) all the data of the latch pairs forming an LSSD chain. Finally, a third mode, the ABIST mode, in which the functionality of memory unit 12 is tested. It is a self-test which is first performed in a manufacturing environment before the chip is commercially released. A slightly different, more relaxed self-test is performed while the chip is incorporated in the system, for example, at the customer location, and thus in a system environment. As a result, the ABIST mode is used in a different environment referred to hereinafter as the ABIST manufacturing sub-mode and the ABIST system sub-mode.

In the ABIST mode, according to fundamentals of the self-test technique, the ABIST unit 11 generates a plurality of test patterns. Each test pattern consists of a set of deterministic 0's and 1's that are first written into memory 12, read out and compared with an expected pattern. The test pattern sequences play a key role in exercising the memory unit 12 to verify whether the memory unit 12 under test is functioning properly, i.e., to determine whether the READ and WRITE operations have been successfully executed. To that end, ABIST unit 11 generates self-test data signals STDATA, self-test address signals STADD, and the self-test read/write address signals STADD, and the self-test read/write control signal STRW.

Three groups of multiplexers select the signals to be fed to the memory unit 12. They include either the external signals mentioned above which are generated outside the SRAM macro 10, namely, DATAIN1 . . . DATAINM, ADDIN1 . . . ADDINP, and R/WIN or, alternatively, internal self-test signals generated by the ABIST unit 11 previously mentioned, namely, the STDATA, STADD, and STRW signals. The multiplexers forming these three groups are respectively referenced 13-1 to 13-M, 13'-1 to 13'-P, and 13". The selection is made by the ABIST control signal. Normally, external signals are selected when the ABIST signal is held at a logic "0", whereas when signals internally generated by the ABIST unit 11 are selected, it is held at a logic "1". The ABIST signal thus allows SRAM macro 10 to operate either in the SYSTEM mode or in the ABIST mode. The three groups of multiplexers, i.e., 13-1 to 13-M, 13'-1 to 13'-P, and 13' form multiplexer block 13. The outputs of the first and second groups are labelled DATA bus and ADD bus, with M and P as their respective bit widths. The output of multiplexer 13" is a single line that transports the R/W control signal that determines the READ/WRITE operating mode of memory 12.

The data-out signals that are outputted by memory 12 are stored in a plurality of data-out L1/L2 pairs of latches (14-1 to 14-M) forming the data-out shift register 14. Generally, these data-out latch pairs are incorporated into the memory 12. The data-out signals that are outputted by the L1 and L2 latch pairs are labelled DATAOUT1 to DATAOUTM (DATAOUT bus), and DOUT1 to DOUTM (DOUT bus), respectively.

In the ABIST mode, after performing a READ operation, expected data signals (EXDATA) are generated by ABIST 11 on the EXDATA bus and compared in the data compression unit 15 via data-out signals DOUT1 to DOUTM. Typically, only four test patterns are used in each word of memory 12: alternating 0's and 1's, i.e., 0101 . . . 01 and 1010 . . . 10, all 0's and all 1's. Alternatively, there are only four self-test data signals, labelled STDATA0, STDATA1 and their respective complements. Because of the particular structure of these four test patterns, the data-out signals DOUT1 to DOUTM are divided into even and odd data-out signals. The even data-out signals that are outputted from the data-out shift register unit 14 are labelled DOUT2, DOUT4, . . . , DOUT2j, and likewise, the odd data-out signals are labelled DOUT1, DOUT3, . . . , DOUT(2j-1), wherein j is an integer equal to M/2, assuming that M is an even number. Since all the even and odd numbered bits of the data-out signals have simultaneously the same "0" or "1" value, only two expected data signals are required, each consisting of a single bit, EXDATA0 and EXDATA1. For instance, assuming that the data-out signals to be read on the DOUT bus are: 010101 . . . 01, the expected data signal EXDATA0 (for the even numbered bits) will be "1" and the expected data signal EXDATA1 (for the odd numbered bits) a "0". EXDATA0 and EXDATA1 are thus the expected results of the even and odd data-out signals, respectively. Finally, data compression unit 15 generates a signal labelled RESULT which is held at a "1" if a mismatch occurs during the comparison. By mismatch it is to be understood that at least one data-out signal does not have the same logic value as its corresponding even or odd expected data generated by the ABIST structure 11. This mismatch is often caused by a defective word line in the memory unit 12 at a predetermined address. This mismatch is usually referred to as a "fail". Alternatively, if all data-out signals match the corresponding even or odd expected data signals (which means no fall is detected), the RESULT signal is held at "0". The RESULT signal, which is often referred to as the FAIL FOUND LAST CYCLE signal, indicates after completing a READ operation, whether the memory unit 12 at the current address being tested is defective. The RESULT signal is thus indicative of the fail/no fail status of memory unit 12 on a cycle by cycle basis.

Another key component of the prior art SRAM macro 10 is the fail register unit 16. It is required because, in the ABIST manufacturing sub-mode, the addresses of the defective word lines have to be identified, then memorized for subsequent use in the SYSTEM mode. When the RESULT signal is raised to a logic "1", indicating the presence of a fail, the word portion of the current address generated by the ABIST unit 11 on the STADD bus, (labelled STADD*), is stored in a bank of pairs or latches of this fail address register unit 16. This stored word address thus corresponds to the address of a defective word line.

The ABIST unit 11 also generates a CNOOP (NOOP stands for NO OPERATION) signal to inhibit the ABIST self-test mode, when the totality of the test pattern sequences has been fully exercised on the memory unit 12. This signal is required when there is a plurality of SRAM macros embedded in a single semiconductor chip. The macros may have different sizes that require varying durations for their respective test. The CNOOP signal generated by the ABIST unit of each SRAM macro allows the memory units of all macros to be simultaneously tested.

Clocking of SRAM macro 10 is achieved using standard procedures in accordance with LSSD rules. In the state of the art architecture of a SRAM macro, as illustrated in FIG. 1, clocking would normally be implemented by standard external LSSD clock signals labelled A, B, C, S and CS (CHIP SELECT for a stand-alone SRAM chip or ARRAY SELECT for a SRAM macro). Note that the S clock signal, which is substantially the same as the B clock signal, is applied to the L2 latches of latch pairs 14-1 to 14-M of data-out shift register 14. In the ABIST manufacturing sub-mode, the clock and CS signals are derived from the tester. In the ABIST system sub-mode, these signals are generated by the system clock. The SCAN-IN (SI) signal is applied to the ABIST unit 11 according to the standard LSSD rules, as illustrated in FIG. 1. However, for sake of simplicity, the SCAN-OUT signal generated by the ABIST 11 in response to the SCAN-IN signal to be applied to the next latch pair, etc., along the whole LSSD chain, is not shown. In the following description, only latches will be referred to, while it is clear that according to LSSD rules, they are in reality pairs of latches. All these signals are directly applied to ABIST unit 11 and/or to the memory 12, except for the C clock and CS signals. The C clock signal is applied to one input of a 2-way AND gate 17A. The CS signal is applied to one input of the 2-way AND gate 17B. The CNOOP signal is applied to the second input of AND gates 17A and 17B as a gating signal in order to block, when needed, the transmission of the respective C clock and CS signal. This occurs when the self-test has been completed in the ABIST mode, and permanently in the SYSTEM mode. The A, B, and S clock signals are used during the SCAN mode, whereas the B, C, S and CS signals are used during the ABIST mode. The CS signal is used alone in the SYSTEM mode while and the LSSD clock signals are held in a non-active state. Numeral 18 schematically illustrates the clock distribution scheme in the SRAM macro 10 and also includes the internal chip clock distribution network servicing it. This terminates the description of a state of the art SRAM macro provided with an ABIST structure.

The state of the art ABIST described in U.S. Pat. No. 5,173,906 is organized around a state machine approach for determining self-test data and self-test read/write stimuli on a cycle by cycle basis. According to the previously described ABIST, the generation of self-test data STDATA, self-test address STADD, and self-test read/write STRW signals implies the use of a large number of combinational logic circuits which is based on a hard-coded mechanism. Moreover, this mechanism is known to be relatively slow and with limited programmability. As a result, a higher level of complexity in the state machine logic circuitry would be required to meet the present demand (expected to grow in the future) for the ABIST self-test of high speed SRAM macros with ever decreasing memory access times. The conventional state machine based unit described in the above cited reference has typically a system cycle time of 10–13 ns for a CMOS SRAM macro which requires nine logic levels of data generation and state machine logic circuitry, leading to a total of about 200 logic gates. This large number not only unfavorably impacts the memory access time measurement and ABIST cycle time, but also results in an excessive consumption of the semiconductor chip real estate. Consequently, there is today a strong need for developing new ABIST structures wherein the above mentioned intrinsic limitations or drawbacks are overcome.

OBJECTS OF THE INVENTION

Therefore, it is a primary object of the present invention to provide a processor-based ABIST circuit that is fully compatible with previously known state machine based ABIST units and which can advantageously be implemented in a high speed SRAM macro.

It is another object to provide a processor-based ABIST circuit adapted to the test of high speed SRAM macros and characterized by having short memory access times.

It is yet a further object to provide a processor-based ABIST circuit adapted to the test of high speed SRAM macros having a minimum system cycle time.

It is a more particular object to provide a processor-based ABIST circuit which offers reduced complexity in terms of logic circuit integration and significant macro size reduction.

It is still another object to provide a processor-based ABIST circuit that has a high programmability.

It is yet a further object to provide a processor-based ABIST circuit that is adaptable to any SRAM macro architecture.

SUMMARY OF THE INVENTION

These objects will be accomplished, in particular, by an integrated circuit, such as a SRAM macro, which includes a processor-based ABIST circuit which includes a SRAM macro comprising: ABIST means for generating self-test data (STDATA), self-test address (STADD), expected data (EXDATA), self-test read/write (STRW) and gating (CNOOP) signals; memory means responsive to the self-test data, self-test address, and self-test read/write signals to generate data-out (DOUT) signals when the ABIST means is in an ABIST mode; data compression means responsive to the ABIST means and to the memory means for comparing the data-out signals output by the memory unit with the expected data (EXDATA) signals to generate a signal (RESULT) that is indicative of a fail/no fail condition in the memory means on a cycle by cycle basis; fail register means responsive to the ABIST means and to the data compression means to store a defective memory address; clock and control signal generating means for generating LSSD clock signals for sequencing the SRAM macro, and control signals (ABIST, . . . ) for selecting the ABIST mode; and processor-based ABIST circuit means comprising: address generator means for generating self-test addressing signals; control logic means responsive to the address generator means for generating control signals for sequencing the processor-based circuit means; and processing means responsive to the control logic means for writing into and for verifying data outputted by the memory means, and for determining whether the memory means is in a READ or a WRITE operating mode.

In contrast to conventional state machine based ABISTs which are based on hard-coded pattern generated self-test data whose implementation requires nine logic levels and thus the use of a large number of combinational logic circuits, the new structure relies upon a processor-based ABIST circuit performing repetitive operations on programmable data. The processor-based unit of the present invention requires fewer logic levels when compared to a conventional structure and which leads to a significant reduction in the number of combinational logic circuits used.

From a hardware point of view, this processor-based ABIST circuit basically consists of three blocks: a conventional address generator block, a specific control logic block generating control signals, and an innovative processing block driven by control signals.

The conventional address generator block generates the CNOOP, STADD, and the STBAOE and STWAOE (self-test bit and word address signals that are used to generate the LSB's on the following cycle) signals as standard, but the two latter signals will be used in a novel control logic main block. The role of the control logic main block is to force proper signal sequencing of the processing main block during the ABIST mode at every memory address. To that end, it generates four control signals TS0, TS1, and their complements, CTS0 and CTS1. Control signals are determined by the type of test patterns and the ABIST cycle. The processing main block has the key role of generating the STDATA, the EXDATA, and the STRW signals, in response to the control signals. The processing main block first includes three data generators. Each data generator is essentially comprised of four LSSD scan-only latches (that are initialized during the SCAN mode) forming a table of data sub-block and a 4 to 1 multiplexer sub-block. The multiplexer sub-block selects one of four scan-only latch outputs and is controlled by a logic combination of the four control signals. The data generators are designed to be very fast. The processing main block further includes three latch pairs, one for each data generator, to capture the signals that are outputted by the multiplexer sub-block for subsequent release during the following cycle. The signals that are outputted from the data generators, are referred to as OROUT signals. The two first OROUT signals are stored into the two first latch pairs to generate the STDATA signals. The third OROUT signal is stored in the third latch pair to generate the STRW signal. Finally, the STDATA signals are stored in two latch pairs to generate the corresponding EXDATA signals.

Therefore, according to the basic principles of the present invention tables of data are first initialized during the SCAN mode. Next, these tables are multiplexed at every cycle during the ABIST mode. Multiplexing of the self-test data and the self-test read/write signals is performed processing by the main block under the control of the control logic main block.

BRIEF DESCRIPTION OF THE DRAWINGS

The features believed to be characteristic of this invention are set forth in the claims. The invention itself, however, as well as other objects and advantages thereof, may be best understood by reference to the following detailed description of an illustrated preferred embodiment to be read in conjunction with the accompanying drawings.

Figure 2:
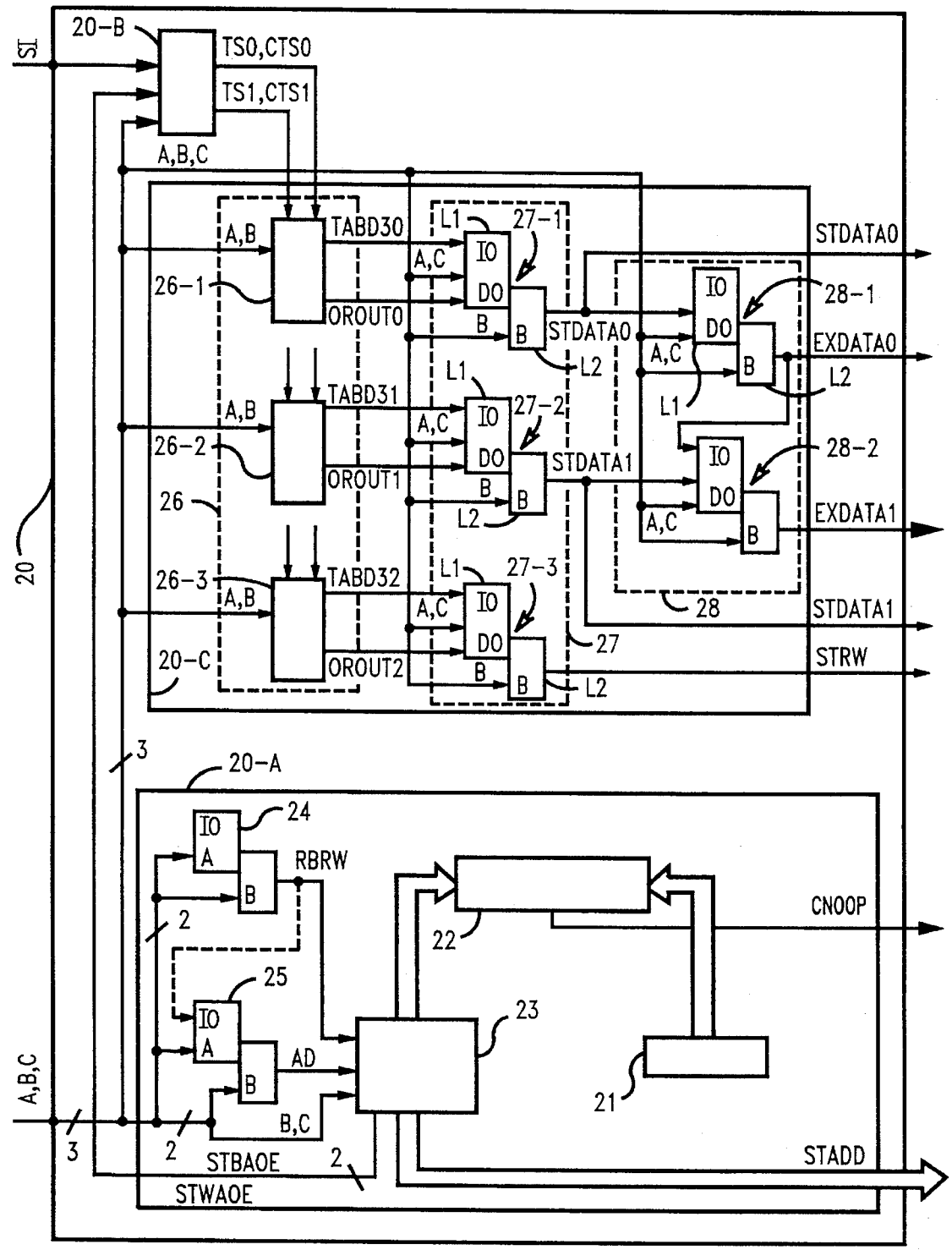
FIG. 2 shows a schematic block diagram of the processor-based ABIST circuit of the present invention including three main blocks, to be implemented in the ABIST unit of the SRAM macro of FIG. 1.
Figure 3:
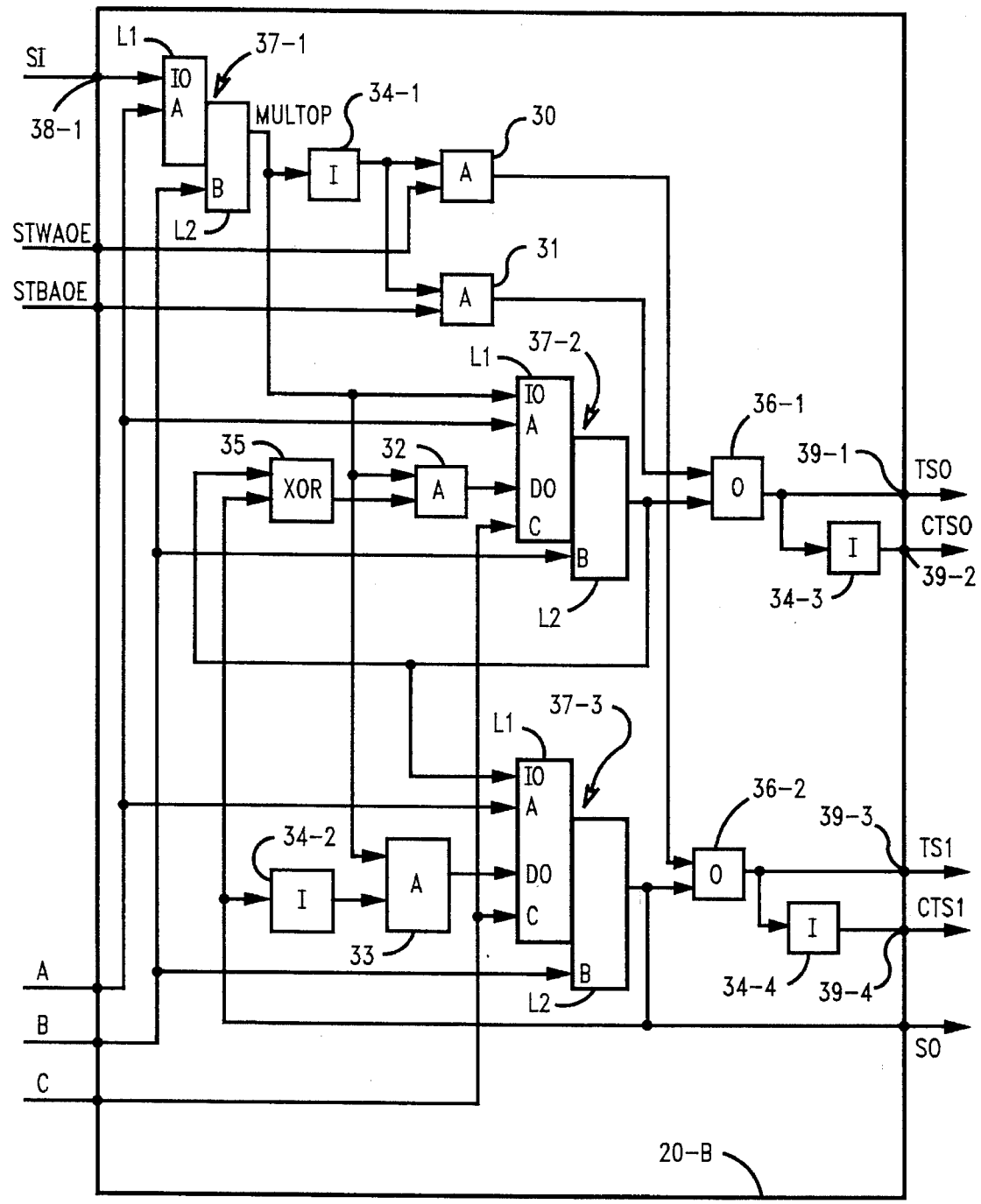
FIG. 3 shows circuit details of the control logic main block of the processor-based circuit of FIG. 2.
Figure 4:
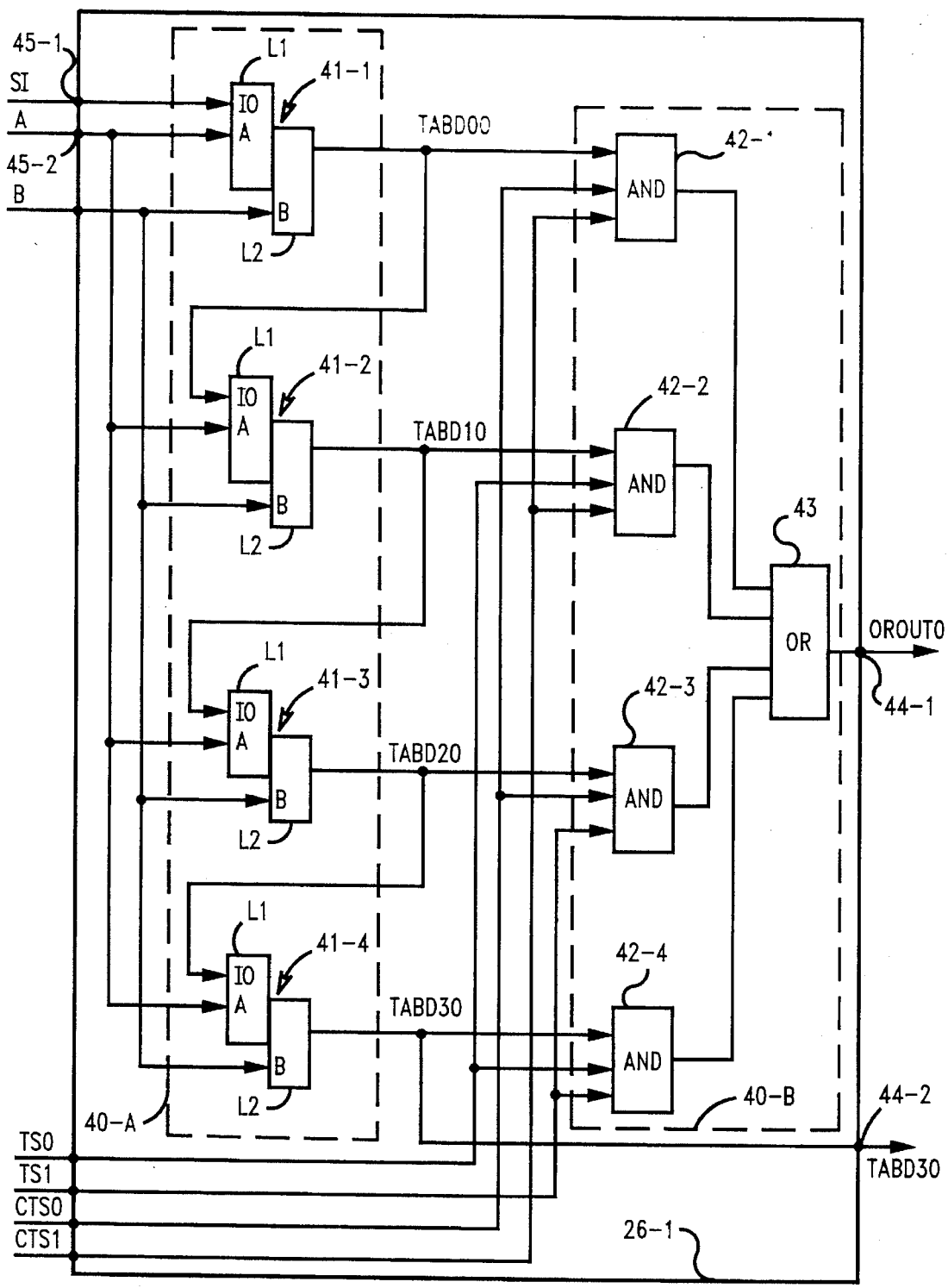
FIG. 4 shows circuit details of one of three data generators which are an essential part of the processing main block of the processor-based circuit of FIG. 2.

Note that for sake of simplicity, the various SCAN-IN/SCAN-OUT signals shown in FIGS. 2 to 4 have not been represented or are shown in dotted lines. Because these interconnections are proper to an LSSD design, they fall within the scope of ordinary skill in the art.

DESCRIPTION OF A PREFERRED EMBODIMENT

Figure 1:
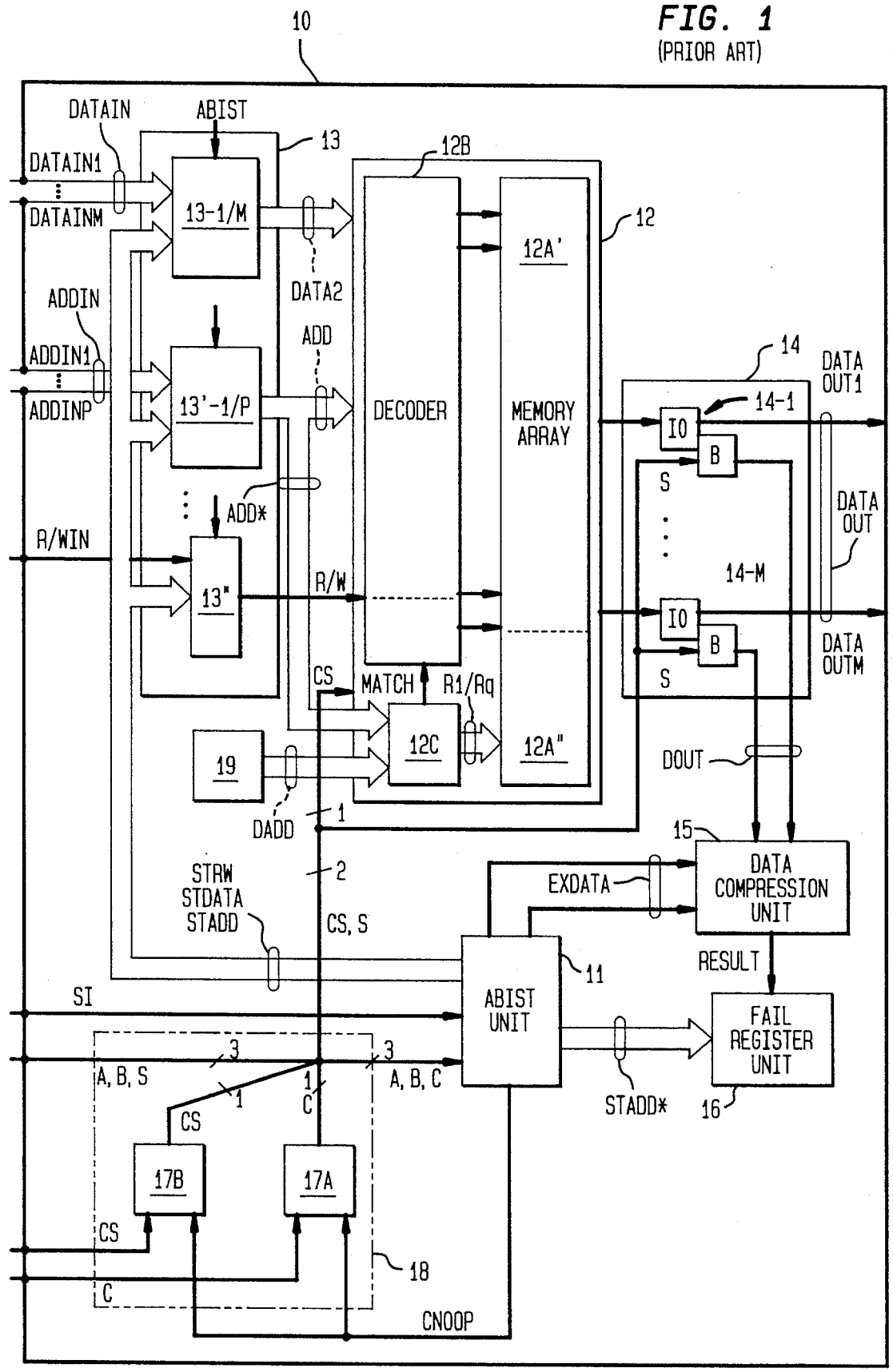
FIG. 1 shows a partial schematic view of the block diagram architecture of a state of the art SRAM macro including an ABIST.

FIG. 2 illustrates major elements of the processor-based ABIST circuit 20 that plays an important role in the operation of ABIST 11 of FIG. 1, according to the present invention. The processor-based ABIST circuit 20 consists of three main blocks: a conventional address generator block 20-A, a control logic block 20-B which forces proper ABIST sequencing of circuit 20, and an innovative processing block 20-C.

Address generator main block 20-A is the addressing section of circuit 20. It generates the STADD (self-test address) signal, the STBAOE (self-test bit address 0 early), the STWAOE (self-test word address 0 early) and the CNOOP signals. The CNOOP signal is a gating signal that flags the end of the ABIST mode in the testing of memory 12 by gating AND gates 17A and 17B in FIG. 1.

Main block 20-A first includes a register 21 containing the maximum addresS, an address comparator 22, and a high speed synchronized up/down counter 23 that can be programmed to use the bit address or the word address as the LSB (least significant bit), when counting through the address space. It further includes two L1/L2 latch pairs referenced 24 and 25 to supply the RBRW (ripple bit ripple word) and the AD (address decrement) signals, respectively, to the up/down counter 23. In essence, main block 20-A operates as an incrementer/decrementer which can have either a bit address or a word address as its LSB. The AD and RBRW signals are initialized during the SCAN mode. The AD signal controls whether the counter increments or decrements. The RBRW signal controls whether the LSB of the counter is a bit address or a word address. The address counter changes every cycle or every four cycles depending on the data initialized in the latch pair 37-1 which generates the MULTOP signal, as will be explained hereinafter, in conjunction with FIG. 3. The STADD bus conveys the STADD signals that control the memory unit 12 addressing during the ABIST mode. Signals STBAOE (self-test bit address 0 early) and STWAOE (self-test word address 0 early) are two early addresses. In conventional ABIST units, these signals were only internally used in address generator main block 20-A, but now according to the present invention, they are also sent to the control logic main block 20-B. The CNOOP signal is activated as soon as the address counter 23 reaches the maximum address when incrementing (or the zero address when decrementing). This CNOOP signal appears when the test pattern sequence has been fully exercised during the ABIST mode and acts as a gating signal as mentioned above. Address counter 23 will automatically stop address sweeping as soon as the whole address space has been swept. Note that main block 20-A is considered to be state of the art, since its architecture is of current use in conventional ABIST structures, e.g., as in the ABIST described in U.S. Pat. No. 5,173,906.

Control logic main block 20-B is the control signal generator section of circuit 20. It is driven by the STBA0E and STWA0E signals generated by address generator 20-A. It is designed to deliver four control signals labelled TS0, TS1, and their respective complements, CTS0 and CTS1. These four control signals are essential to the operation of the processing main block 20-C and, in particular, to the operation of the data generator, labelled 26-1 to 26-3, contained therein. This main block 20-B will be more detailed by reference to FIG. 3.

Still referencing to FIG. 2, processing main block 20-C generates the following signals: self-test data STDATA, expected data EXDATA, and self-test read/write STRW The STDATA signals are used for writing into memory 12, whereas the EXDATA signals are used to verify that the values outputted from memory 12 via data-out shift register unit 14 and data compression unit 15 (see FIG. 1) are correct. Finally, main block 20-C generates the STRW signal to control whether or not the memory unit 12 is in a READ or WRITE operating mode. Main block 20-C consists of three data generators 26-1 to 26-3, which jointly form block 26. The signals that are outputted therefrom, respectively referred to as OROUT0 to OROUT2 signals, are delayed by one cycle, using three latch pairs 27-1 to 27-3, which together form block 27. The first two latch pairs 27-1 and 27-2 generate STDATA, i.e., STDATA0 and STDATA1. The third latch pair 27-3 generates STRW. In turn, STDATA signals are latched in latch pairs 28-1 and 28-2 which jointly form block 28, to generate the EXDATA, i.e., EXDATA1 and EXDATA2.

Main block 20-B will be now considered by reference to FIG. 3, which shows the detailed circuit construction thereof. Control logic main block 20-B is comprised of four 2-way AND gates 30 to 33, four inverters 34-1 to 34-4, one 2-way exclusive. OR (XOR) gate 35, two 2-way OR gates 36-1 and 36-2, one L1/L2 scan-only latch pair 37-1 and two L1/L2 regular latch pairs 37-2 and 37-3. Each regular latch pair includes an L1/L2 latch combination. L1 of each pair has an IO input and an A clock input which allows the data at the IO input to be captured. In addition, L1 has a D0 input and a C clock input to allow capture of the data at the D0 input. The scan-only latch pair has an identical construction with regard to the regular latch pair except that its L1 latch is not provided with the D0 and C inputs. The L2 latch of the scan-only and regular latch pairs have a B clock input that allows the data to be transferred from the L1 latch to the L2 latch. The L2 latch of the scan-only and regular latch pairs has an output with the same logic value as the data contained in L2. Note that the three latch pairs 37-1 to 37-3 are connected in an LSSD scan chain. The input signals that are applied to main block 20-B are: the SCAN-IN signal (SI), A, B and C clock signals externally generated, and the two signals labelled STWAOE and STBAOE, generated in the address generator main block 20-A of FIG. 2. The signals that are outputted are TS0, TS1 and their complements CTS0, CTS1. In FIG. 3, the input and output terminals are generically referenced 38 and 39 respectively.

The SI signal Is applied to the IO input of latch pair 37-1. The output of latch pair 37-1 is connected to the IO input of L1 of latch pair 37-2, to the input of inverter 34-1, and to the first input of AND gates 32 and 33. The output of inverter 34-1 is connected to the first input of AND gates 30 and 31. The STWAOE and STBAOE signals are respectively applied to the second input of AND gates 30 and 31. The second input of AND gate 32 is attached to the output of XOR gate 35, and the second input of AND gate 33 is connected to the output of inverter 34-2. The first and second inputs of the XOR gate 35 are connected to the output of latch pairs 37-2 and 37-3, respectively. Note that the signal outputted by latch pair 37-3 is typical of the so-called SCAN-OUT (SO) signals which play an important role in LSSD circuit designs. The input of inverter 34-2 is also connected to the output of latch pair 37-3. The first and second inputs of OR gate 36-1 are connected to the output of AND gate 31 and to the output of the latch pair 37-2 respectively. The output of OR gate 36-1 supplies the control signal TS0 at terminal 39-1 and its complement CTS0 via inverter 34-3 at terminal 39-2. The first and second inputs of OR gate 36-2 are connected to the output of AND gate 30 and to the output of the latch pair 37-3 respectively. Similarly, the output of OR gate 36-2 supplies the control signal TS1 at terminal 39-3, and its complement CTS1 via inverter 34-4, at terminal 39-4. As is apparent from FIG. 3, the A and B clock signals are applied to the scan-only latch pair 37-1, and the A, B, and C clock signals are applied to the regular latch pairs 37-1 and 37-3, as standard. The MULTOP signal that is generated at the output of latch pair 37-1 controls the functional mode of the control logic main block 20-B, depending on its logic value. In the ABIST mode, main block 20-B has two operating modes: the single operation sub-mode and the multiple operation sub-mode. In the single operation sub-mode, the MULTOP signal is low, control signals TS0 and TS1 having the same logic values as the ones defined by the STWAOE and STBAOE signals, respectively. Only AND gates 30 and 31 are operative in this sub-mode. In the multiple operation sub-mode, the MULTOP signal is at a high level, and signals TS0 and TS1 are counted in a modulo-4 fashion. In this sub-modes the two latch pairs 37-2 and 37-3, and their related logic circuitry are operative. The MULTOP signal also controls whether the address counter 23 (see FIG. 2) changes its content every cycle or every four cycles. Finally, OR gates 36-1 and 36-2 determine the appropriate selection between the two sub-modes.

Referring again to FIG. 2, the core of the processor-based ABIST unit 20 resides in the processing main block 20-C, whose essential part consists of the three data generators 26-1 to 26-3 that have an identical structure, and which together form data generator block 26. Data generators play a determining role in the table of data selection function. A detailed circuit implementation of the data generator 26-1 will now be described in conjunction with FIG. 4.

The data generator 26-1 is comprised of two sub-blocks 40-A and 40-B. Table of data sub-block 40-A comprises four LSSD scan-only latch pairs 41-1 to 41-4. Multiplexer sub-block 40-B is comprised of four 3-way AND gates 42-1 to 42-4, connected to a 4-way OR gate 43. Each of the four scan-only latch pairs 41-1 to 41-4 contains data for a single cycle. Control signals TS0, TS1 and their complements CTS0, CTS1, choose which of the four data will be sent to memory 12 during the next cycle. The input signals of data generator 26-1 are: the SCAN-IN signal (SI), the A, B clock signals and the four control signals TS0, TS1, CTS0 and CTS1.

The SI signal is applied to the IO input of latch pair 41-1. The output of latch pair 41-1 (in fact, the L2 latch output, where signal TABD00 is available), is connected to the IO input of latch pair 41-2. Likewise, the output of latch pair 41-2, where signal TABD10 is available, is connected to the IO input of latch pair 41-3. In turn, the output of latch pair 41-3, wherein signal TABD20 is available, is connected to the 0 input of latch pair 41-4. The signal which is generated by latch pair 41-4 (referenced TABD30) is outputted from data generator block 26-1 and is applied to the IO input of latch pair 27-1, as apparent from FIG. 2. The signals TABD00 to TABD30 essentially perform a SCAN-IN/SCAN-OUT function. The output of each latch pair 41-1 to 41-4 is connected to the first input of the 3-way AND gates 42-1 to 42-4, respectively. The signals at the remaining two inputs of the AND gates interact with a combination of the four control signals generated by logic control main block 20-B. As illustrated in FIG. 4, AND gate 42-1 has as its inputs: the TABD00 signal supplied by latch pair 41-1, the CTS0 and CTS1 signals. AND gate 42-2 has for inputs: the TABD10 signal supplied by latch pair 41-2, the TS0 and CTS1 signals. AND gate 42-3 has for inputs: the TABD20 signal supplied by latch pair 41-3, the CTS0 and TS1 signals. Finally, AND gate 42-4 has for inputs: the TABD30 signal supplied by latch pair 41-4, the TS0 and TS1 signals.

The output of each AND gate 42-1 to 42-4 is connected to the respective input of a four-way OR gate labelled 43 which performs the Boolean addition of the signells outputted by the said AND gates. The output terminal 44-1 of OR gate 43 delivers the OROUT0 signal and is connected to the D0 input of the latch pair 27-1 (see FIG. 2), according to an essential feature of the present invention.

As a final result, the combination of the four AND gates 42-1 to 42-4 and the OR gate 43 forming sub-block 40-B performs a multiplex function under the control of the four control signals. Sub-block 40-B selects which of the four TABDOO to TABD30 signals that are outputted from sub-block 40-A, is to be propagated to the D0 input of the regular latch pair 27-1 of FIG. 2. In other words, the signal applied to the D0 input of the regular latch pair 27-1 will have the same logic value as one of the four signals TABD00 to TABD30 generated by respective latch pairs 41-1 to 41-4.

The description of data generator 26-1 given by reference to FIG. 4, also applies to the remaining data generators 26-2 and 26-3, since they all have identical structures.

Now referring again to FIG. 2, data generators 26-1, 26-2 and 26-3 generate intermediate output signals labelled OROUT0, OROUT1, OROUT2 and SCAN-IN/SCAN-OUT signals labelled TABD30, TABD31 and TABD32, respectively. Signals TABD30 and OROUT0 are respectively applied to the IO and D0 inputs of latch pair 27-1. Still referring to latch pair 27-1, the A and C clock signals are applied to the A and C inputs (not shown) of the L1 latch. Likewise, the B clock signal is applied to the B input of the L2 latch. The same reasoning applies to latch pairs 27-2 and 27-3. Latch pairs 27-1 to 27-3 store signals OROUT0 to OROUT2, for one cycle, and Jointly, they form storage delay block 27. Latch pairs 27-1 and 27-2, respectively, supply the self-test data signals STDATA0 and STDATA1. Latch pair 27-3 supplies the self-test read/write stimuli signal STRW. The STDATA0 and STDATA1 signals are applied to respective D0 inputs of latch pairs 28-1 and 28-2. The output of latch 28-1 is connected to the I0 input of latch 2 pair 28-2 since the two latch pairs are connected to form a LSSD chain. Latch pairs 28-1 and 28-2, which Jointly form the EXDATA generator block 28, respectively, supply the EXDATA0 and EXDATA1 signals. The STDATA0 and STDATA1 signals are also outputted from processing block 20-C for subsequent use, as apparent from FIG. 2. Finally, five signals are outputted from processing block 20C: STDATA0 and STDATA1 (STDATA), EXDATA0 and EXDATA1 (EXDATA), and STRW.

In main block 20-C of FIG. 2, data generators 26-1 to 26-3 have the determining role of ensuring a 4 to 1 multiplexing, to generate the self-test data STDATA, and the required self-test read/write STRW signals if there is a maximum of four operations per address. However, this can be readily generalized to an N to 1 multiplexing, so as to perform N operations per address. The table data initialization is completed during the SCAN mode in view of the LSSD design of main block 20-C. After the SCAN mode has been completed, the processor-based ABIST circuit 20 is capable of performing the programmed pattern at high speed by simply choosing the correct data from the table. After one full address sweep has been performed on memory 12 in an incrementing or decrementing mode, the processor-based ABIST circuit 20 will exercise the test patterns in the memory 12 at each address, from a zero address to a maximum address that was initialized during the SCAN mode previously mentioned. Again, in the SCAN mode, a new initialization is performed and the latch pair data is analyzed. The operation of the processor-based ABIST circuit 20 of the present invention will be explained by reference to the timing waveforms illustrated in FIG. 5.

Figure 5:
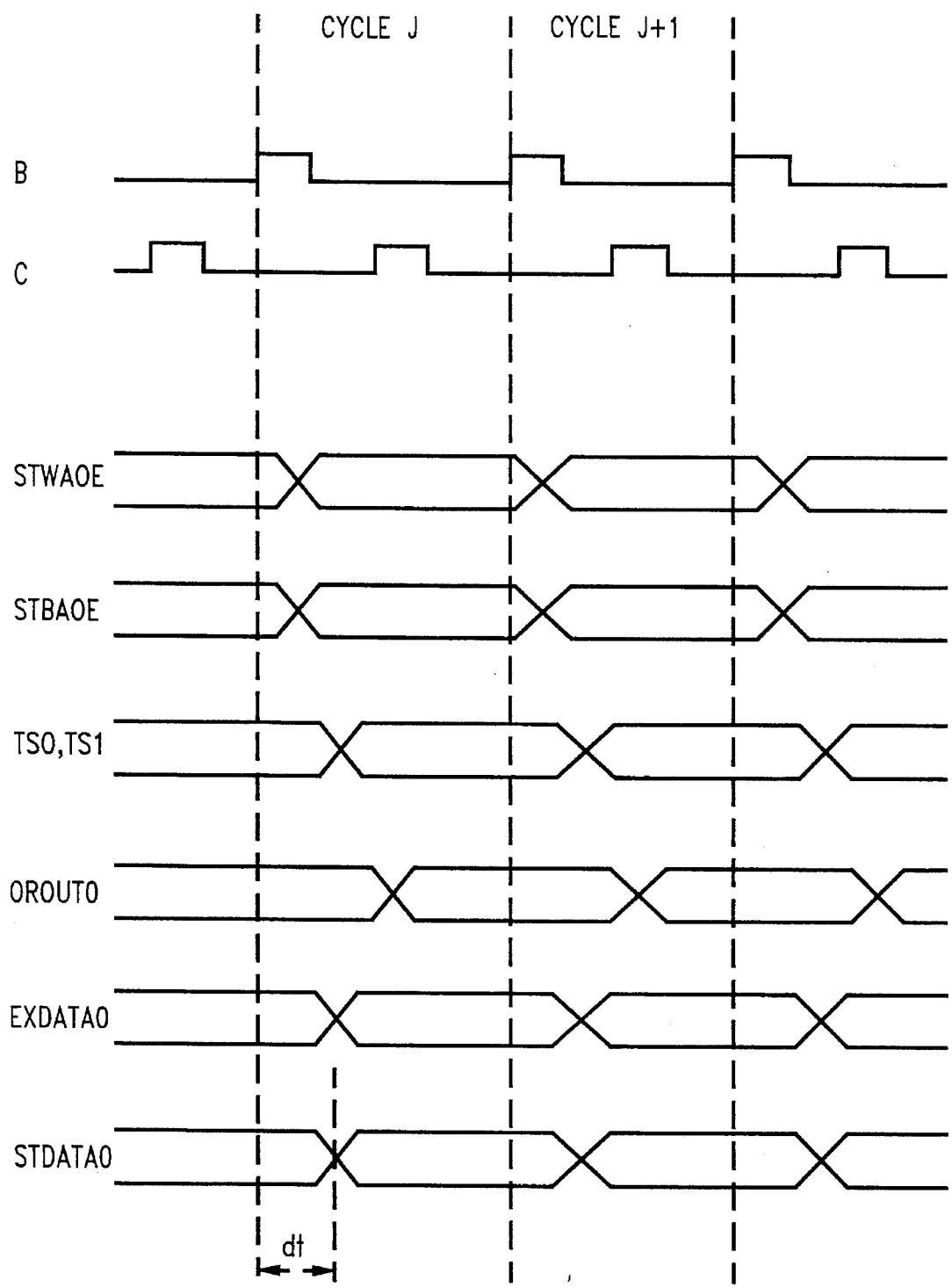
FIG. 5 shows waveforms of the essential signals to illustrate operation of the processor-based ABIST circuit of FIG. 2 in the ABIST mode.

FIG. 5 shows in detail the timing waveforms of the clock, control and data signals for the processor-based ABIST circuit 20 in the ABIST mode. Two successive cycles denominated cycle J and cycle J+1 are illustrated. Shown below the B and C clock signals are the STWAOE, STBAOE address signals, the TS0, TS1 control signals, and the OROUT0, EXDATA0, STDATA0 data signals. The C clock signal is used to capture data into all the L1 latches of all the regular pairs of latches of processor-based ABIST circuit 20, but it does not; trigger any of the signal transitions shown in FIG. 5. When the B clock signal rises, the data in the L1 latch of each L1/L2 latch pair is allowed to propagate to the L2 latch output, at which time, signals can change value. The delay between the rising edge of the B clock signal and the transition of a particular address, control, or data signal is a function of the delay in the processor-based ABIST circuit 20. For example, OROUT0 signal has a transition later than TS0, as a result of the extra delays caused by the two logic levels of sub-block 40-B (FIG. 4). It will be understood that the exact placement of the different address, data and control signals depicted in FIG. 5, for a particular processor based ABIST circuit depends upon the specific parameters of the design system and the manufacturing process involved. Selection of these exact quantitative timings is well within the purview of one ordinary skilled in the art.

The processor-based ABIST circuit 20 of the present invention has greater flexibility in terms of programmability than the state machine described in U.S. Pat. No. 5,173,906. This is illustrated as follows. If a new test pattern is necessary to detect a failure that was not detected during a first pass, processor-based ABIST circuit 20 can be reprogrammed with new test patterns late in the manufacturing cycle. This is achieved by mere changes to the test pattern initialization which was not previously possible. Another advantage of the processor-based ABIST circuit of the present invention, with respect to the state machine approach of the prior art, is its design simplicity, which will result in a reduced number of design errors. With conventional state machines, designing many custom logic blocks would have been required to meet the short system cycle time that are now required for present high speed SRAM macros. By adopting the processor-based approach of the present invention, the highly desired short cycle times can be obtained without designing custom logic blocks.

The conventional state machine based ABIST requires many combinational logic circuits to generate each hard-coded test pattern, and a large sequencer that sequentially steps there through. As a result, the data generation requires a large number of logic circuit levels (9 levels) due to all the control logic and the large number of internal signals that need to be taken into account. Compared with a conventional ABIST, implementation of the processor-based ABIST circuit 20 of the present invention, in a standard CMOS technology, would have reduced the macro size, by at least 50%, saving thereby a significant area in the semiconductor chip. In addition, the self-test data is now generated in about 2.1 ns (illustrated by delay dt in FIG. 5) as opposed to approximately 6.3 ns obtained by a conventional ABIST. In the future, new ABIST structures will be designed to run in short system cycle times of 5 ns or less.

Moreover, unlike the conventional state machine based ABIST units, the novel processor-based ABIST circuit of the present invention can be programmed for each task such as a "write 0 blanket pattern", or a "read complement checkerboard pattern", and the like without any limitation. As a result, all the test patterns that were generated with the conventional state machine based ABIST units are still available, as well as an assortment of new programmable test patterns. Finally, the processor-based ABIST circuit 20 can fit any conventional ABIST structure of the state machine type.

In summary, the advantages of the architecture of the processor-based ABIST circuit of the present invention are: faster data generation, reduced complexity for minimal semiconductor area consumption, extended programmability, and full compatibility.

Although the present invention has been described for SRAM macros, the processor-based ABIST circuit 20 may find large applications in DRAMs, flash memories . . . etc, and in stand-alone chips as well.

We claim:

1. An SRAM provided with:

ABIST means for generating self-test data (STDATA), expected data (EXDATA), self-test read/write (STRW) and gating (CNOOP) signals; and memory means responsive to said self-test data, and self-test read/write signals to generate data-out (DOUT) signals when said ABIST means is in an ABIST mode, said SRAM comprising:

processor-based ABIST circuit means that includes:

address generator means for generating self-test addressing signals;

control logic means responsive to said address generator means for generating control signals for sequencing said processor-based circuit means; and processing means responsive to said control logic means for writing into and for verifying data outputted by said memory means, and for determining whether said memory means is in a READ or a WRITE operating mode.

2. The SRAM as recited in claim 1, wherein said address generator means generates the CNOOP, the self-test address (STADD), and the self-test bit address 0 early (STRAOE) and self-test word address 0 early (STWAOE) signal.

3. The SRAM as recited in claim 1, wherein said control logic means generates control signals (TSO, CISO, . . . ) to force sequencing the processor-based ABIST means.

4. The SRAM as recited in claim 1, wherein said processing means further comprising:

a plurality off data generator means driven by said LSSD clock signals responsive to said control signals for generating a plurality of intermediate output signals (OROUTO, . . . ) that condition the STDATA and STRW signals to be used on a following cycle;

a first plurality of latch pairs respectively driven by said plurality of data generator means to store intermediate output signals and for generating the STDATA and STRW signals; and a second plurality of latch pairs respectively driven by said first plurality of latch pairs corresponding to the number of said STDATA signals to store the STDATA signals and for generating the EXDATA signals on the following cycle.

5. The integrated circuit of claim 1 wherein each of said data generator comprises:

a table of data sub-block formed by a plurality of scan-only latch pairs connected in a LSSD chain, said chain comprising L1 and L2 latches that are respectively driven by said LSSD clock signals; and a multiplexer sub-block comprising:

a corresponding plurality of AND gates, each of said gates being gated by a combination of said control signals, and driven by the signal that is outputted by the corresponding latch pair of the table of data subblock; and an OR gate to perform the boolean addition of the plurality of signals that are outputted by said AND gates to generate a corresponding intermediate output signal (OROUTO).

6. The SRAM as recited in claim 1, further comprising:

data compression means responsive to said ABIST means and to said memory means for comparing said data-out signals output by the memory unit with said expected data (EXDATA) signals to generate a signal (RESULT) that is indicative of a fail/no fail condition in the memory means on a cycle by cycle basis; fail register means responsive to said ABIST means and to said data compression means to store a defective memory address; and clock and control signal generating means for generating clock signals for sequencing said SRAM macro, and control signals (ABIST, . . . ) for selecting said ABIST mode.

7. The SRAM as recited in claim 6, wherein said clock signals are LSSD signals.

* * * * *